United States Patent [19]

Peeren

[11] Patent Number: 5,457,388

[45] Date of Patent: Oct. 10, 1995

[54] MAGNETIC RESONANCE APPARATUS INCLUDING ELEMENTS FOR HOMOGENIZING THE MAGNETIC FIELD

[75] Inventor: Gerardus N. Peeren, Eindhoven, Netherlands

[73] Assignee: U.S. Philips Corporation, New York, N.Y.

[21] Appl. No.: 254,093

[22] Filed: Jun. 6, 1994

[30] Foreign Application Priority Data

Nov. 25, 1993 [BE] Belgium .................. 09301305

[51] Int. Cl.⁶ .................................................. G01V 3/00
[52] U.S. Cl. ........................................ 324/320; 324/319
[58] Field of Search ........................... 324/320, 319, 324/318, 322, 307, 309; 128/653.5

[56] References Cited

U.S. PATENT DOCUMENTS

| | | | |
|---|---|---|---|
| 4,771,243 | 9/1988 | Vreugdenhil et al. | 324/320 |
| 4,853,663 | 8/1989 | Vermilyea | 324/320 |
| 4,931,759 | 6/1990 | Breneman et al. | 324/320 |
| 4,983,922 | 1/1991 | Tahara | 324/320 |
| 5,237,275 | 8/1993 | Takechi et al. | 324/319 |

FOREIGN PATENT DOCUMENTS

| | | |
|---|---|---|
| 0216404 | 4/1987 | European Pat. Off. . |
| 0303880 | 2/1989 | European Pat. Off. . |

*Primary Examiner*—Louis Arana
*Attorney, Agent, or Firm*—Jack D. Slobod

[57] ABSTRACT

Magnetic resonance apparatus includes an essentially cylindrical magnet system (2) for generating a steady magnetic field (H) in a measurement space (28), a coil system (4) for generating gradient fields in the measurement space, and at least one RF coil (10) which is arranged in the immediate vicinity of the measurement space. In order to increase the homogeneity of the main magnetic field (H), approximately annular first elements (44) of a magnetically conductive material are provided within the magnet system (2) so as to extend coaxially with respect to the axis (9) of the magnet system. In order to minimize the amount of magnetically conductive material required, the first elements (44) are situated in the immediate vicinity of the RF coil (10).

20 Claims, 4 Drawing Sheets

MAGNETIC RESONANCE APPARATUS INCLUDING ELEMENTS FOR HOMOGENIZING THE MAGNETIC FIELD

BACKGROUND OF THE INVENTION

The invention relates to a magnetic resonance apparatus which comprises an essentially cylindrical magnet system for generating a steady magnetic field in a measurement space, a coil system for generating gradient fields in the measurement space, and at least one RF coil which is arranged in the immediate vicinity of the measurement space, approximately annular first elements of a magnetically conductive material being provided coaxially with the axis of the magnet system in order to increase the homogeneity of the steady magnetic field within the magnet system.

1. Field of the Invention

An apparatus of this kind is known from EP-A-0 216 404 which corresponds to U.S. Pat. No. 4,771,243: In the known apparatus the first elements are formed by rings of a ferromagnetic material which are arranged in recesses in the coil former for the gradient coils. A comparatively large amount of ferromagnetic material is required for this purpose. The cited document specifies that the rings should have an axial dimension of between 1 and 10 cm and a thickness of up to 2 cm. Furthermore, adaptation of the magnetic field correction provided by the first elements to changing circumstances is virtually impossible. This becomes apparent, for example from the fact that the document states that a compromise must be found for magnet systems required to operate with different field strengths. The correction provided by the first elements, therefore, is not optimum for any of the field strengths used.

SUMMARY OF THE INVENTION

It is an object of the invention to provide an apparatus of the kind set forth in which less ferromagnetic material is required and in which optimum adaptation of the first elements to changing circumstances is possible at least in principle. To achieve this, the apparatus in accordance with the invention is characterized in that the first elements are situated in the immediate vicinity of the RF coil. The invention is based on the recognition of the fact that the effect of the first elements rapidly decreases as the distance from these elements becomes greater. If the first elements are situated at the area of the coil former of the gradient coils, like in the known apparatus, their distance from the measurement space is comparatively large so that a large amount of ferromagnetic material is required to achieve the desired effect. The RF coil, however, is situated in the immediate vicinity of the object being examined. Consequently, due to the step in accordance with the invention the first elements are also situated in the immediate vicinity of the object, so that the magnetic field to be homogenized is situated at a very small distance from these elements. Consequently, the first elements need contain only a very small amount of magnetically conductive material in order to exert the desired effect. Moreover, thanks to said small distance, the homogeneity of the magnetic field can be adjusted with a precision which is substantially higher than in the known device. Because the first elements contain only a small amount of ferromagnetic material, they can be readily exchanged. Thus, first elements providing optimum correction of the magnetic field can be mounted before each examination.

In many cases the RF coil is essentially cylindrical and arranged so as to be coaxial with the magnet system. The distance between the first elements and the diagnostically relevant area can then be minimized by using an embodiment of the apparatus in accordance with the invention which is characterized in that the first elements are provided at the inner side of the RF coil.

A further embodiment of the apparatus of the invention is characterized in that the first elements are formed by strips of a magnetically conductive material which are provided on an electrically insulating carder of the RF coil or on an electrically insulating housing enclosing the RF coil. This embodiment offers the advantage that no separate carrier is required for the first elements. The first elements can then be exchanged together with the RF coil, or the part of the housing supporting these elements can be constructed so that it can be separately exchanged.

In many cases optimum homogeneity of the magnetic field is required in a limited region only. This is the case, for example when the chest or shoulders of a patient are to be examined. The height of the area of interest is then substantially smaller than the width and the homogeneity of the magnetic field above and below the part of the patient to be examined is less important. In such cases a further saving can be realised as regards the amount of magnetically conductive material by utilizing an embodiment which is characterized in that each of the first elements is shaped as two arc-shaped pans of equal length which extend opposite one another and symmetrically relative to the axis of the magnet system. In the described case the arc-shaped pans may extend to both sides of the shoulders of the patient.

It has been found that in some cases it is difficult to achieve the desired homogeneity of the steady magnetic field in the measurement space by means of exclusively the first elements. Therefore, a further embodiment of the apparatus in accordance with the invention is characterized in that there is provided a carrier which is coaxial with the magnet system and whose radial dimensions are substantially larger than those of the RF coil, on said carrier there being provided second elements which cooperate with the first elements so as to increase the homogeneity of the steady magnetic field at the area of the measurement space. The second elements are preferably formed as strips or plates of a magnetically conductive material. However, they can alternatively be formed by correction coils which are fed by a suitable current source. Preferably, on the carrier there are also provided further correction elements which serve to correct incidental deviations in the steady magnetic field which are caused by manufacturing tolerances. These further correction elements can also be formed, for example by plates of a magnetically conductive material or by coils. This kind of correction for manufacturing tolerances is known per se, for example from EP-A-0 303 880. Cost and space can be saved by combination of the latter two forms of correction.

BRIEF DESCRIPTION OF THE DRAWINGS

These and other aspects of the invention will be described in detail hereinafter with reference to the drawing, wherein.

DETAILED DESCRIPTION OF THE PREFERRED EMBODIMENTS

Figure 1:
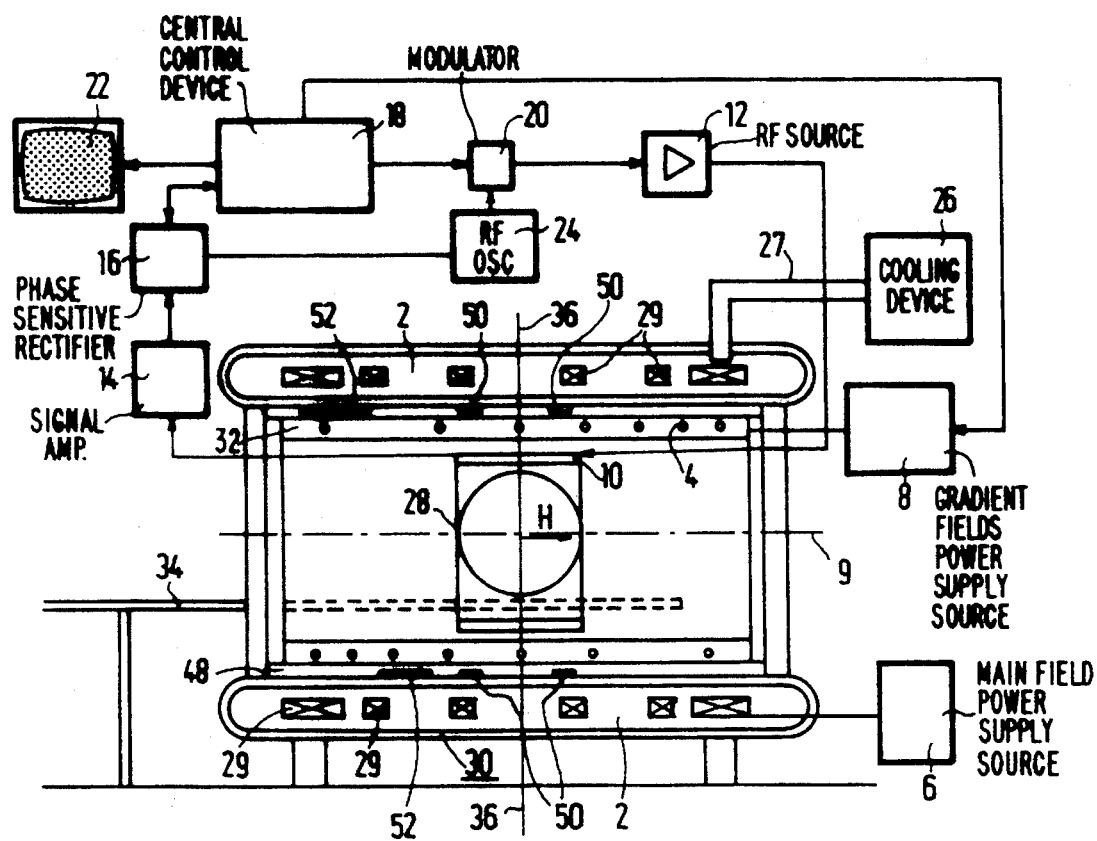
FIG. 1 shows diagrammatically an embodiment of a magnetic resonance apparatus in accordance with the invention.

A magnetic resonance apparatus as shown in FIG. 1 comprises an essentially cylindrical magnet system 2 for generating a steady, uniform main magnetic field H, a likewise cylindrical magnet system 4 for generating magnetic gradient fields, and power supply sources 6 and 8 for the magnet system 2 and the magnet system 4, respectively. The magnet systems 2 and 4 have a common axis 9. An RF magnet coil 10 serves to generate an RF magnetic alternating field; to this end it is connected to an RF source 12. For detection of spin resonance signals generated by the RF transmitted field in an object to be examined, use can also be made of the RF coil 10; the coil 10 is then connected to a signal amplifier 14. The signal amplifier 14 is connected to a phase-sensitive rectifier 16 which is connected to a central control device 18. The central control device 18 also controls a modulator 20 for the RF source 12, the power supply source 8 for the gradient coils 4, and a monitor 22 for display. An RF oscillator 24 controls the modulator 20 as well as the phase-sensitive rectifier 16 which processes the measurement signals. For cooling, if any, of the magnet coils 2 for the main field H there is provided a cooling device 26 which includes cooling ducts 27. Such a cooling device may be constructed, for example as a water cooling system for resistive coils or, for example as a liquid helium cooling system for superconducting magnet coils. The essentially cylindrical RF coil 10, arranged coaxially within the magnet systems 2 and 4, encloses a measurement space 28 which is sufficiently large to accommodate a patient to be examined in the case of a medical diagnostic apparatus. Thus, in the measurement space 28 there can be generated a uniform magnetic field H, gradient fields for selecting slices of the object, and a spatially uniform RF alternating field. Herein, the RF coil is assumed to combine the functions of transmitter coil and measurement coil. However, for both functions use can also be made of different coils, for example, surface coils which are used as the measurement coils. These coils are preferably cylindrical, but need not necessarily be so.

The coil system 2 is in this case formed by six coils 29 of equal diameter which are accommodated as superconducting coils in a dewar vessel 30 for liquid helium which can be introduced therein by the cooling device 26. A gradient coil holder 32, supporting the gradient coils 4, is arranged inside the coils 29 for the main field H in a customary manner. An axially displaceable patient table 34 is provided to accommodate a patient to be examined in the measurement space 28. The magnet systems 2 and 4 and the RF coil 10 are in most cases symmetrically arranged relative to a symmetry plane 36. However, this is not absolutely necessary.

Figure 2:
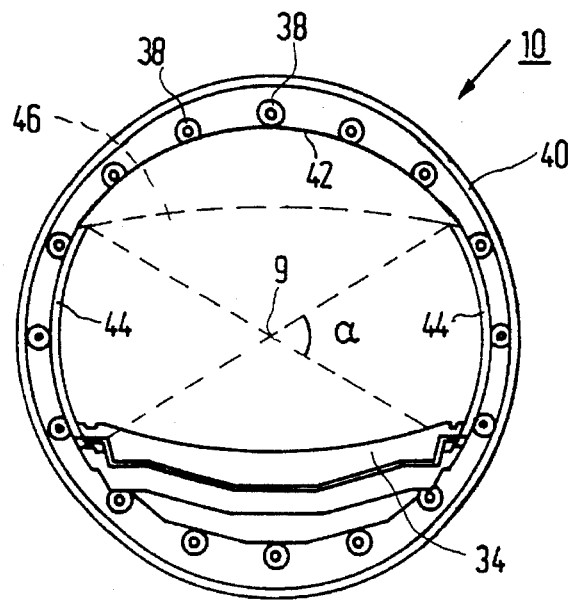
FIG. 2 is a cross-sectional view of an embodiment of an RF coil for the apparatus shown in FIG. 1.
Figure 3:
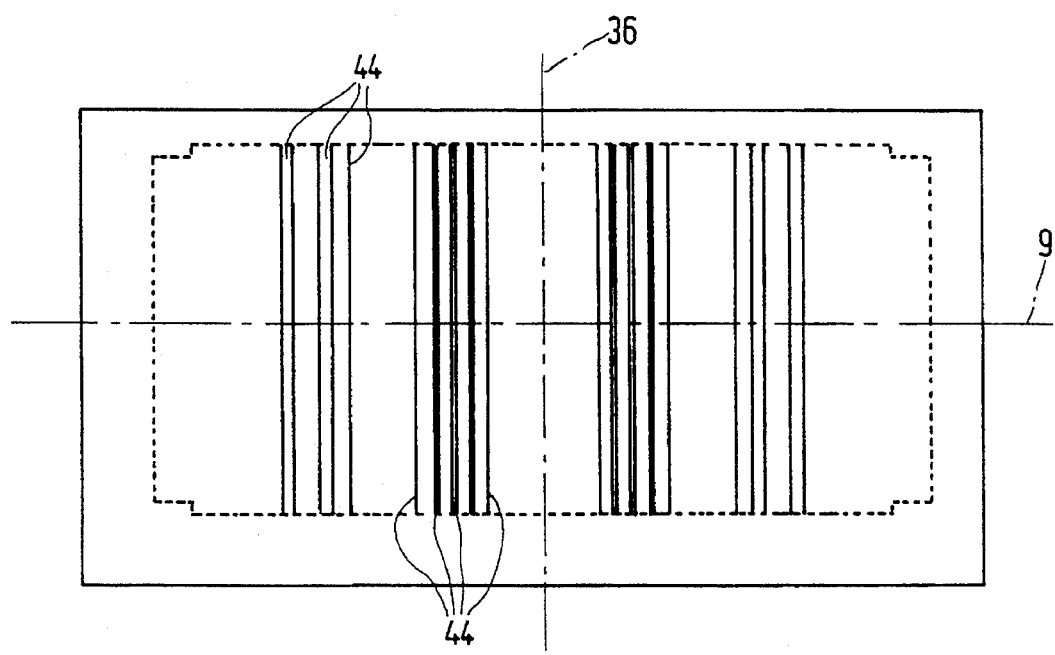
FIG. 3 shows a part of the RF coil shown in FIG. 2, and FIGS. 4 to 7 show diagrams illustrating the improvement of the homogeneity of the steady field as can be achieved by means of the steps of the invention.

FIG. 2 is a cross-sectional view of an embodiment of the RF coil 10 in which the patient table 34 is positioned. In the present embodiment the RF coil 10 comprises a number of electrically conductive rods 38 which extend parallel to the axis 9 of the magnet system 2 and which are distributed across a cylindrical surface which is coaxial with said axis. The rods 38 are enclosed by an electrically insulating housing which consists of an outer cylinder 40 and an inner cylinder 42. On the inner cylinder 42 there are provided strips 44 of a magnetically conductive material, for example iron, which constitute first elements for increasing the homogeneity of the steady magnetic field H generated by the magnet system 2. In the present embodiment each time two strips 44 extend symmetrically to the axis 9 and opposite one another at an angle $\alpha$ which is equal to 60°. The two strips 44 together constitute a first element. FIG. 3 shows that a number of pairs of strips 44 is provided in different axial positions within the RF coil 10, i.e. in this case 14 pairs of strips which are symmetrically situated relative to the symmetry plane 36. The width of the strips 44 amounts to, for example a few mm and their thickness amounts to from a few tens to some hundreds of microns. The total amount of iron required, therefore, is comparatively small. In cooperation with the magnet system 2, the first elements produce a very homogeneous steady magnetic field in a region 46 which extends horizontally between the strips 44 and whose dimension in the vertical direction is determined by the angle $\alpha$ at which the strips extend, being 60° in this case. This shape of the homogeneous region is very suitable for the examination of, for example the chest and shoulders of a patient positioned on the patient table 34. Above and below the homogeneous region 46 no parts of the patient are then situated, because the patient's dimension in the horizontal direction is greater than that in the vertical direction. For other examinations it may be desirable to choose a different shape of the homogeneous region 46. This is readily possible by variation of the angle $\alpha$ enclosed by the strips 44. The number of strips 44 and their dimensions can be chosen in dependence on the desired shape and dimensions of the homogeneous region in planes containing the axis 9.

Figure 4:
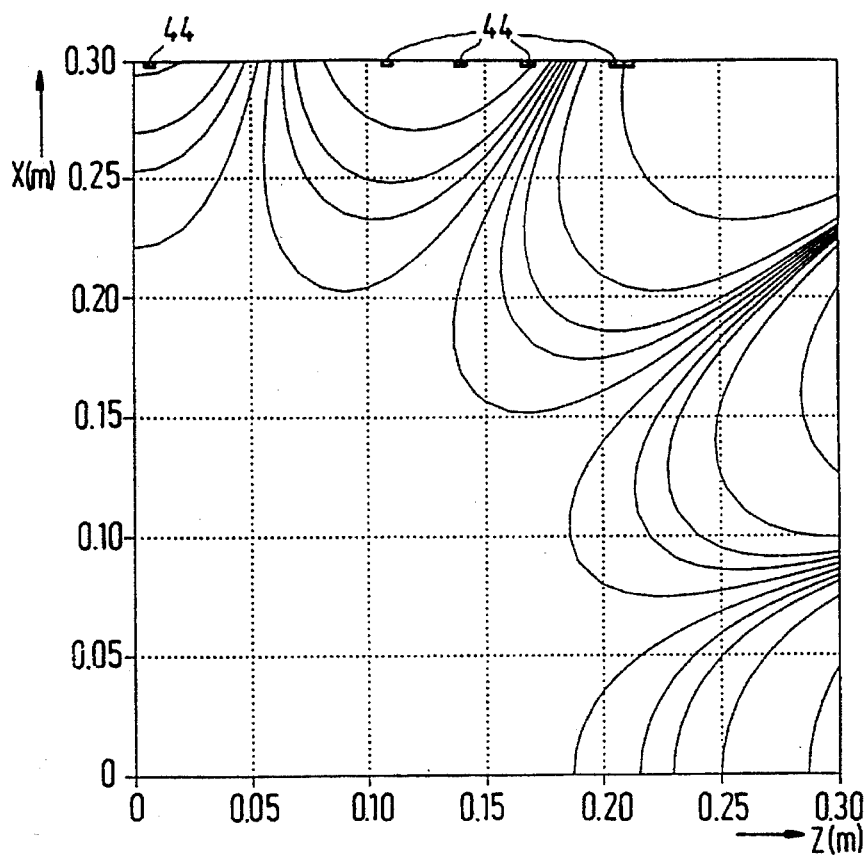
Figure 5:
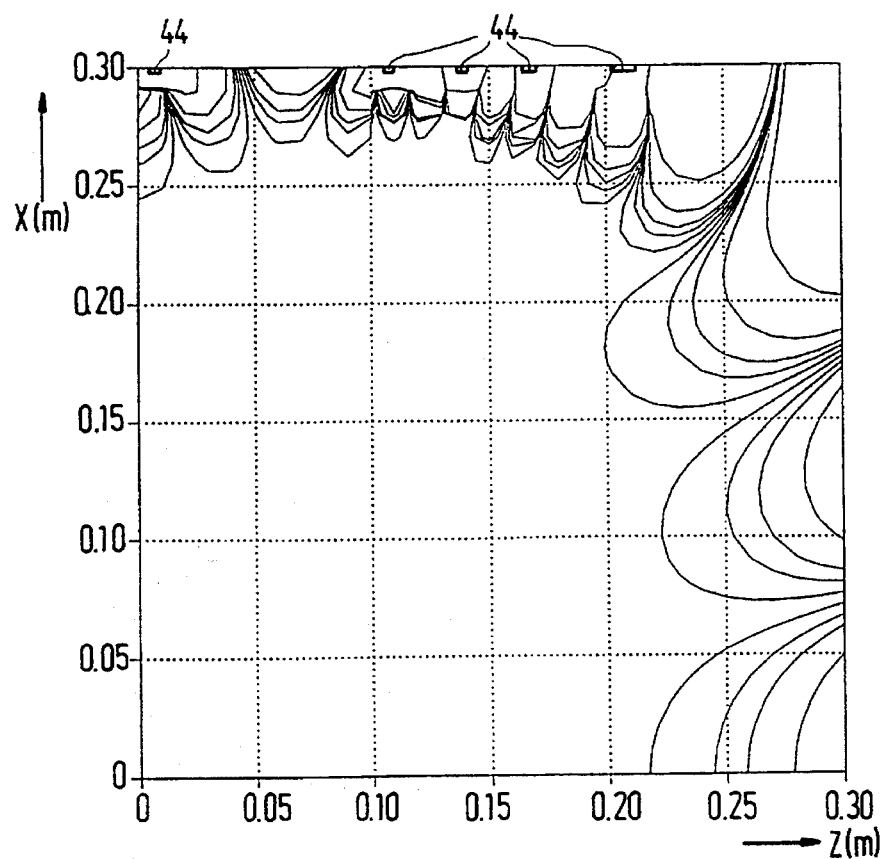
Figure 6:
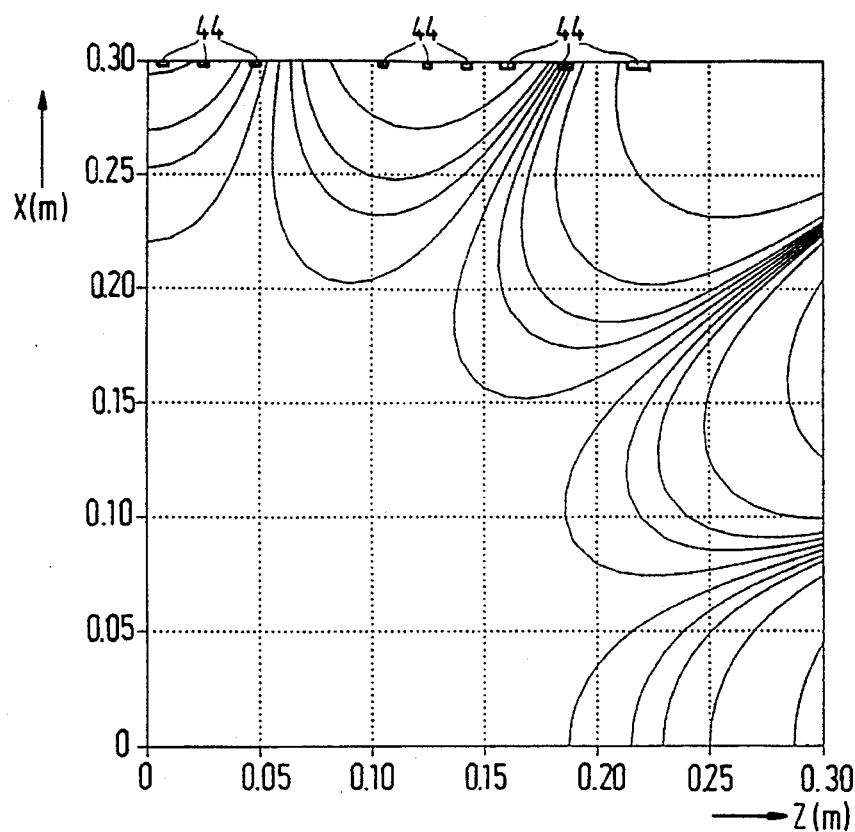
Figure 7:
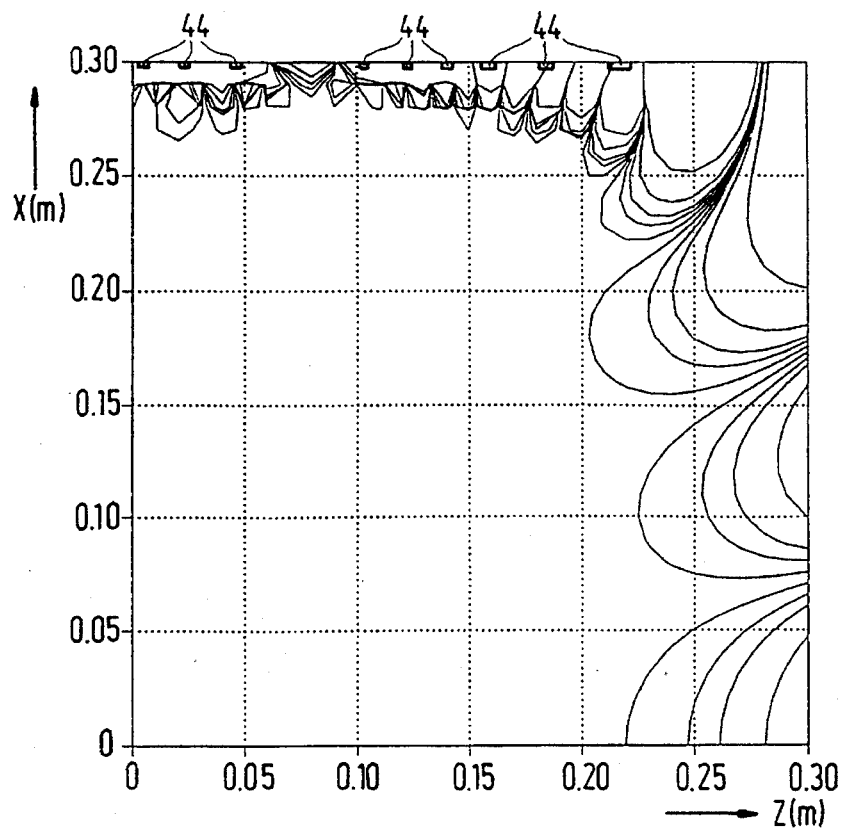

FIGS. 4 to 7 show the course of the lines of equal field strength of the steady magnetic field in a quadrant of the XZ plane, the Z-axis being coincident with the axis 9 and the X-axis extending in the horizontal direction in the symmetry plane 36. FIG. 4 shows the field generated by the magnet coils 29 without the influence of the first elements 44. The locations in which the first elements 44 are to be mounted, however, are shown in FIG. 4. In the present example there are five first elements 44, so in the event of a symmetrical arrangement relative to the plane z=0 ten first elements are provided. FIG. 5 shows the field of the same coils as in FIG. 4 after addition of said first elements 44. This Figure clearly shows that the homogeneous region has increased substantially, notably in the X-direction. FIG. 6 shows the same field as FIG. 4, be it that now the locations for a larger number of first elements 44 are indicated, i.e. nine in this case, so a total number of eighteen in the case of a symmetrical arrangement. The result of the combination of these first elements with the coils 29 is shown in FIG. 7. This Figure shows that the homogeneous region has become even larger in comparison with FIG. 5. The shape and the magnitude of the homogeneous region can thus be adapted to different requirements by selection of the number, the locations and the dimensions of the first elements 44. The first elements 44 can be constructed so as to be exchangeable, for example by constructing the part of the inner cylinder 42 on which the first elements are situated to be exchangeable. It has been found that small deviations in the spacing of the first elements 44 (up to, for example 0.5 mm) have only a slight effect on the homogeneity of the magnetic field. The same holds for deviations up to approximately 5 mm in respect of the axial position of the assembly of the first elements 44 and for deviations of up to approximately 2 mm in the radial direction.

Adjustment of the desired homogeneity of the steady magnetic field in the measurement space 28 by means of exclusively the first elements 44 appears to be very difficult in some cases. In order to solve this problem, it is generally desirable to provide a carrier 48 which is coaxial with the magnet system and whose radial dimensions are substantially larger than those of the RF coil 10, second elements 50 being provided on said coaxial carrier. The carrier 48 with the second elements 50 is shown in FIG. 1. Therein, the carrier 48 is arranged between the magnet system 2 and the gradient coil system 4. In the present embodiment the second elements 50 consist of plates or strips of a magnetically conductive material. Their dimensions may be of the same order of magnitude as those of the first elements 44. The second elements 50 can also be formed, if desired, by coils which are fed by a suitable current (not shown).

In conjunction with the magnet coils 29 and possibly the second elements 50, the first elements 44 produce a very homogeneous magnetic field in a selected region 46. Therefore, the designing of the magnet system 2 requires calculation of the correct combination of magnet coils 29 and first and second elements 44 and 50 for any envisaged application. In addition, manufacturing tolerances may also give rise to incidental deviations in the magnetic field generated. The first and second elements 44 and 50 do not have any significant effect on such deviations. However, it is known per se to correct for such deviations by means of further correction elements 52 which can be provided, as desired, on an own carrier (not shown) or on the carrier 48 already present for the second elements 50. An example of such a carrier with correction elements which can be arranged at random is known from EP-A-0 303 880. The correction elements therein consist of plates of a magnetically conductive material. Correction elements consisting of coils are also known.

I claim:

1. A magnetic resonance apparatus comprising an essentially cylindrical main magnet system for generating a steady main magnetic field in a measurement space, a gradient coil system situated within an inside diameter of the main magnet system for generating gradient fields in the measurement space, at least one RF coil which is situated within an inside diameter of the gradient coil system and in the immediate vicinity of the measurement space, and approximately annular first elements of a magnetically conductive material which are arranged coaxially with the axis of the magnet system and are situated within the inside diameter of the gradient coil system and in the immediate vicinity of the RF coil for increasing the homogeneity of the main magnetic field within the magnet system.

2. A magnetic resonance apparatus as claimed in claim 1, wherein the RF coil is essentially cylindrical and arranged so as to be coaxial with the magnet system, and the first elements are provided at an inner side of the RF coil.

3. A magnetic resonance apparatus as claimed in claim 2, wherein the first elements are formed by strips of a magnetically conductive material which are provided on an electrically insulating carrier of the RF coil or on an electrically insulating housing enclosing the RF coil.

4. A magnetic resonance apparatus as claimed in claim 3, wherein each of the first elements is shaped as two arc-shaped parts of equal length which extend opposite one another and symmetrically relative to the axis of the magnet system.

5. A magnetic resonance apparatus as claimed in claim 4, further comprising a carrier which is coaxial with the magnet system and whose radial dimensions are substantially larger than those of the RF coil, second elements being provided on said carrier which cooperate with the first elements so as to increase the homogeneity of the main magnetic field at the area of the measurement space.

6. A magnetic resonance apparatus as claimed in claim 5, wherein the second elements are formed as plates or strips of a magnetically conductive material.

7. A magnetic resonance apparatus as claimed in claim 6, wherein further correction elements are provided on the carrier which serve to correct incidental deviations in the main magnetic field caused by manufacturing tolerances.

8. A magnetic resonance apparatus as claimed in claim 2, further comprising a carrier which is coaxial with the magnet system and whose radial dimensions are substantially larger than those of the RF coil, second elements being provided on said carrier which cooperate with the first elements so as to increase the homogeneity of the main magnetic field at the area of the measurement space.

9. A magnetic resonance apparatus as claimed in claim 8, wherein the second elements are formed as plates or strips of a magnetically conductive material.

10. A magnetic resonance apparatus as claimed in claim 2, wherein each of the first elements is shaped as two arc-shaped parts of equal length which extend opposite one another and symmetrically relative to the axis of the magnet system.

11. A magnetic resonance apparatus as claimed in claim 1, wherein the first elements are formed by strips of a magnetically conductive material which are provided on an electrically insulating carrier of the RF coil or on an electrically insulating housing enclosing the RF coil.

12. A magnetic resonance apparatus as claimed in claim 11, wherein each of the first elements is shaped as two arc-shaped parts of equal length which extend opposite one another and symmetrically relative to the axis of the magnet system.

13. A magnetic resonance apparatus as claimed in claim 11, further comprising a carrier which is coaxial with the magnet system and whose radial dimensions are substantially larger than those of the RF coil, second elements being provided on said carrier which cooperate with the first elements so as to increase the homogeneity of the main magnetic field at the area of the measurement space.

14. A magnetic resonance apparatus as claimed in claim 13, wherein the second elements are formed as plates or strips of a magnetically conductive material.

15. A magnetic resonance apparatus as claimed in claim 1, wherein each of the first elements is shaped as two arc-shaped parts of equal length which extend opposite one another and symmetrically relative to the axis of the magnet system.

16. A magnetic resonance apparatus as claimed in claim 15, further comprising a carrier which is coaxial with the magnet system and whose radial dimensions are substantially larger than those of the RF coil, second elements being provided on said carrier which cooperate with the first elements so as to increase the homogeneity of the main magnetic field at the area of the measurement space.

17. A magnetic resonance apparatus as claimed in claim 1, further comprising a carrier which is coaxial with the magnet system and whose radial dimensions are substantially larger than those of the RF coil, second elements being provided on said carrier which cooperate with the first elements so as to increase the homogeneity of the main magnetic field at the area of the measurement space.

18. A magnetic resonance apparatus as claimed in claim 17, wherein the second elements are formed as plates or strips of a magnetically conductive material.

19. A magnetic resonance apparatus as claimed in claim 18, wherein further correction elements are provided on the carrier which serve to correct incidental deviations in the main magnetic field caused by manufacturing tolerances.

20. A magnetic resonance apparatus as claimed in claim 17, wherein further correction elements are provided on the carrier which serve to correct incidental deviations in the main magnetic field caused by manufacturing tolerances.

* * * * *